United States Patent [19]

Gubisch

[11] Patent Number: 5,063,353

[45] Date of Patent: Nov. 5, 1991

[54] METHOD FOR ACCURATE MEASUREMENT OF TRANSMISSION LINE IMPEDANCE BY CORRECTING GROSS IMPEDANCE FOR THE "DRIBBLE-UP" EFFECT

[75] Inventor: Roland W. Gubisch, Lexington, Mass.

[73] Assignee: Beckman Industrial Corporation, San Diego, Calif.

[21] Appl. No.: 480,782

[22] Filed: Feb. 16, 1990

[51] Int. Cl.$^5$ ............................................. G01R 31/08
[52] U.S. Cl. ................................ 324/710; 324/533; 324/525; 364/482; 364/571.02
[58] Field of Search ............... 324/532, 533, 534, 710, 324/720, 699, 691, 525; 379/12, 24, 30; 364/482, 571.01, 571.02

[56] References Cited

U.S. PATENT DOCUMENTS

| | | | |
|---|---|---|---|
| 3,500,204 | 3/1970 | Stromer | 324/534 |
| 4,087,658 | 5/1978 | Hoppough | 379/24 |
| 4,870,532 | 9/1989 | Beatty, Jr. et al. | 324/424 |

FOREIGN PATENT DOCUMENTS 915159 3/1982 U.S.S.R. .............................. 364/482

OTHER PUBLICATIONS

Western Electric Technical Digest No. 14, Apr. 1969, Circuit for Remote Measurement of the Absolute Value of an Impedance or Admittance, Marvin et al.

*Primary Examiner*—Kenneth A. Wieder
*Assistant Examiner*—Maura K. Regan
*Attorney, Agent, or Firm*—Polster, Polster and Lucchesi

[57] ABSTRACT

A method for measuring the impedance of a transmission line. The length and D.C. loop resistance of the line are measured. A pulse is transmitted along the line, the pulse having a duration greater than the time required for it to propogate from its source to the end of the transmission line and reflect back to the source. The transmitted and reflected pulses are monitored and the resultant readings converted to a gross impedance measurement. The measurement is then corrected for the "dribble up" effect. The magnitude of the correction is a function of D.C. loop resistance of the line. The corrected measurement is an accurate measurement of line impedance.

14 Claims, 1 Drawing Sheet

METHOD FOR ACCURATE MEASUREMENT OF TRANSMISSION LINE IMPEDANCE BY CORRECTING GROSS IMPEDANCE FOR THE "DRIBBLE-UP" EFFECT

BACKGROUND OF THE INVENTION

This invention relates to impedance measurements on transmission lines, and more particularly, to a method of performing such measurements using time domain reflectometry (TDR).

In measuring transmission line characteristics using time domain reflectometry (TDR), voltage pulses are applied to the line and line impedances or discontinuities are observed. The technique is used, for example, to locate major faults in a transmission line or cable. The ability to use this measurement technique is compromised, however, by a phenomenon known as "dribble up". The term describes the apparent upward drift in cable impedance as one moves further along the length of the transmission line. Heretofore, the phenomenon has been ascribed to high-frequency skin-effect losses in the line. See, for example, "Time Domain Reflectometry", Hewlett-Packard Application note #62, 1964; or, "Making Automated TDR Measurements", *Handshake, Summer* 1986 John McHugh, Tektronix.

Highly accurate line impedance measurements are often critical; the ability to maintain high speed data communication networks being but one example. To achieve this accuracy, however, "dribble up" effects must be eliminated from the test observations, regardless of the point along the length of the transmission line at which a measurement is made.

SUMMARY OF THE INVENTION

Among the several objects of the present invention may be noted the provision of a method for measuring the impedance of a transmission line or cable; the provision of such a method which utilizes time domain reflectometry (TDR); the provision of such method which takes into account the "dribble up" effect found in measuring transmission line impedances thereby to provide a more accurate impedance measurement than heretofore possible; the provision of such method which recognizes the "dribble up" effect as being a function of transmission line loop resistance rather than as being a function of high-frequency skin effect losses; the provision of such a method which makes it easier to identify cables with major faults; and, the provision of such method which is implemented in appropriate instrumentation or which involves mathematical calculations readily performed once line impedance characteristics have been measured.

The invention, briefly stated, is a method for measuring the impedance of a transmission line and first involves measuring the length and D.C. loop resistance of the line. Next, a pulse is transmitted along the line, the pulse having a duration greater than the time required for it to propogate from the source to the end of the transmission line and reflect back to the source. The transmitted and reflected pulses are monitored and the resultant readings are converted to a gross impedance measurement. Finally, the measurement is corrected for the "dribble up" effect as a function of D.C. loop resistance of the transmission line. The corrected measurement is an accurate measurement of the line impedance.

Other objects and features will be in part apparent and in part pointed out hereinafter.

DESCRIPTION OF THE PREFERRED EMBODIMENT

Figure 1:
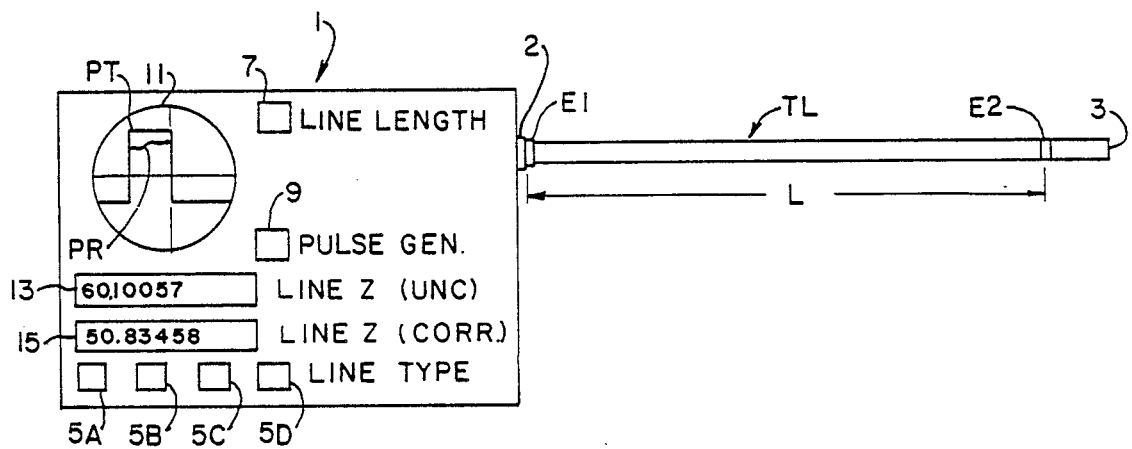
FIG. 1 is a schematic of the test set-up required to perform a time domain reflectometry measurement of a transmission line's impedance.

Referring to the drawings, a method for measuring the impedance of a transmission line TL involves connection of one end E1 of the transmission line to a test instrument 1. The transmission line may be one of a number of various types of transmission lines and may have one of a number of different connectors on its end E1. Instrument 1 has an appropriate mating connector 2 for connecting the instrument to the end of the transmission line; or, alternatively, a suitable adaptor (not shown) is used to attach the transmission line to the instrument. Once the instrument is connected to end E1 of the line, a suitable termination 3 is connected to the other end (end E2) of the line. Preferably, termination 3 terminates line TL in a short circuit.

In the description of the method which follows, it will be understood that various test instruments can be utilized to obtain the different measurements required to determine the impedance of line TL. Or, instrument 1 may incorporate all the testing components required. Such an instrument is disclosed, for example, in a co-pending application Ser. No. 07,482,783 which is incorporated herein by reference. Instrument 1 as depicted in FIG. 1 is exemplary only. However, regardless of the type of equipment used, the impedance measuring technique employed uses time domain reflectometry (TDR) principles. As is well known in the art, TDR involves obtaining an "image" of a very sharply defined test or transmitted pulse which is inserted into one end of a cable under test. The image of the pulse reflected back from the other end of the cable is also obtained. This second image shows changes in line impedance, opens or shorts in the line, as well as how the line is terminated.

Once line TL has been connected to instrument 1 and termination 3 attached to end E2 of the line, the operator presses one of the switches 5A–5D to indicate the type of line being tested. There may be more than four types of transmission lines which instrument 1 can test and rather than using push button switches as shown in FIG. 1, the instrument could utilize a rotary switch with a plurality of positions. The instrument could also permit a coded or other input to be entered into its control electronics (not shown) to indicate the type of line being tested.

The first step required in determining line impedance is measuring the length L and D.C. loop resistance r of the line. To measure the length of the transmission line, the operator of instrument 1 selects control switch 7. Instrument 1 now transmits a pulse along line TL and measures the time required for the pulse to propogate to end E2 of the line and reflect back to the instrument.

The propogation rate of the pulse is determined by the type of line being tested and is a known quantity. Accordingly, the length is calculated by the formula $$L = (nvp \times T)/2$$

where L is the length of the line, nvp is the known propogation rate of the pulse for the type of line being measured, and T is the length of time for the pulse to be propogated down the line and return. The loop resistance of the line is now determined by the formula $$r = R/L$$

where r is the loop resistance, R is the resistance of the line in ohms, and L is the length of the line. After completing the above steps, instrument 1 performs an impedance match between the instrument and line TL. When the match is completed, the operator pushes switch 9. The instrument now begins transmitting a series of pulses along line TL, these new pulses having a pulse duration greater than the time required for them to propogate from instrument 1 to the end of the transmission line and reflect back to the instrument. The transmitted and reflected pulses are monitored. An oscilloscope 11 is used for this purpose. The transmitted and reflected pulses (Pt and Pr respectively) are not only monitored, but the measured amplitudes of the transmitted and reflected pulses are converted into a resultant reading of the gross impedance of line TL. This gross impedance is calculated in accordance with the formula $$Z(t) = Z(o) \times \frac{(1 + rho(t))}{(1 - rho(t))}$$

where Z(t) is the gross impedance measurement, Z(o) is measured near-end line impedance, and rho(t) is the ratio of the voltage amplitude of the reflected pulses Pr to that of the transmitted pulses Pt at a time t. This calculated value may be displayed as, for example, on a digital read-out 13.

Figure 2:
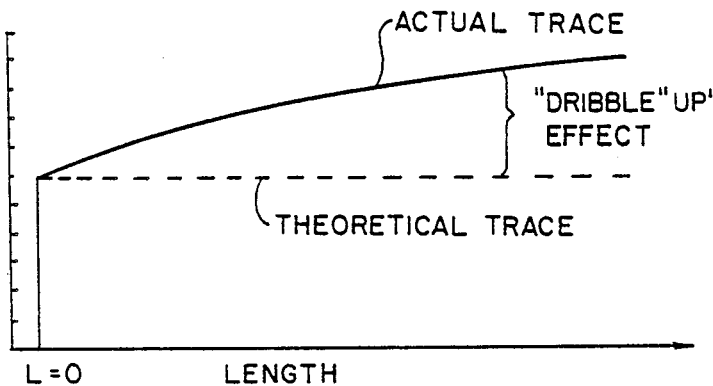
FIG. 2 is a graph representing an actual time domain reflectometry trace for a 50 ohm transmission line.
Figure 3:
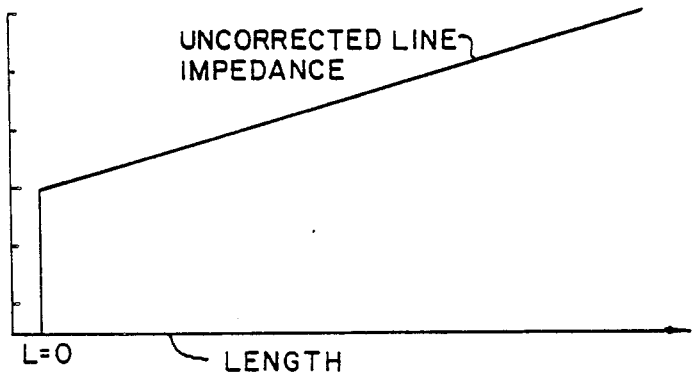
FIG. 3 is a graph representing a calculated impedance for the transmission line without compensating for the "dribble up" effect; and, FIG. 4 is a graph of the true transmission line impedance as corrected for the "dribble up" effect.

Referring to FIGS. 2 and 3, FIG. 2 illustrates graphically what a time domain reflectometry trace looks like for a uniform 50-ohm transmission line. The abscissa represents length along the line and the ordinate rho(t). As shown, at L=0, the value of rho corresponds to the actual line impedance. As the length increases, there is a gradual increase in the value of rho. For a uniform transmission line, the value of rho should be represented by the dashed line extending horizontally across the graph. The difference between these two lines at any point is the result of the "dribble up" effect. In FIG. 3, the abscissa of the graph is again length and the ordinate is measured line impedance Z(t). The graph again illustrates the "dribble up" effect for the uniform 50-ohm line. It is important therefore to obtain an accurate line impedance value to correct Z(t) for the "dribble up" effect.

As discussed, it had previously been thought that "dribble up" was a result of high-frequency skin effect losses in the transmission line. However, this is not so. Rather, it has now been demonstrated that the effect is the result of only transmission line loop resistance. This value is determined as set forth above and can now be used to correct the measured line impedance. The corrected line impedance is calculated in accordance with the formula $$Zo(n) = Zo \times \frac{Z(nvp \times t/2)}{Zo + (A \times r \times nvp \times (t/2))}$$

where Zo(n) is the line impedance corrected for "dribble up", and A is an arbitrary constant fixed by the time at which Zo is measured. As a consequence, the true line impedance is calculated as a function of D.C. loop resistance. In addition, line length, impedance measured near the end of the transmission line, pulse propogation time from the source to the end of the line, and pulse propogation rate are also taken into account in determining the correct impedance. When equipment parameters have been selected such that A=1, the equation may be simplified to $$Zo(n) = Z(nvp \times t/2) - r \times nvp \times (t/2)$$

Figure 4:
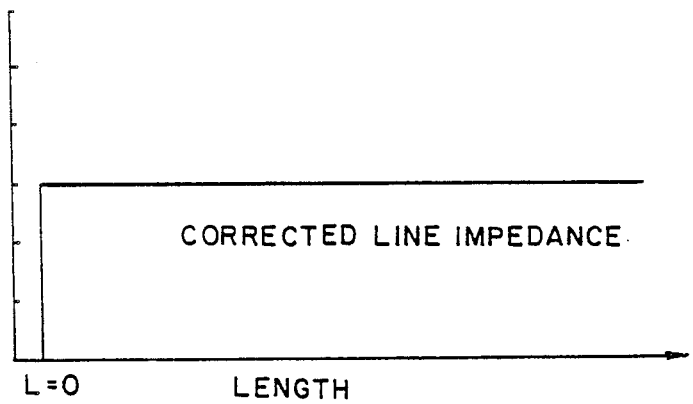

Referring to FIG. 4, the graph shown represents the true line impedance of the transmission line. The line is an essentially horizontal line which is to be expected for a line which is uniform along its length. The corrected impedance value is also displayed on instrument 1 on digital display 15.

To better understand the effect the method of the present invention has on correcting measured impedances for the "dribble up" effect, the following tables present measured and corrected impedances for representative types of coaxial cable and twisted pair cables together with the percentage effect "dribble up" has on the measured versus the corrected impedance values.

TABLE 1

| RG/58, MIL C17 coaxial cable, 50 ohm Z, 46 meters (m) long | | | |
|---|---|---|---|
| Length (m) | Measured Impedance | Corrected Impedance | % Error |
| 5.0 | 53.15* | 48.32* | 10.0 |
| 10.0 | 54.82 | 48.52 | 11.3 |
| 15.0 | 58.29 | 50.27 | 16.0 |
| 20.0 | 58.29 | 49.00 | 19.0 |
| 25.0 | 58.29 | 49.41 | 18.0 |
| 30.0 | 60.10 | 50.76 | 18.4 |
| 35.0 | 56.53 | 47.56 | 18.9 |
| 40.0 | 58.29 | 48.85 | 19.3 |
| 45.0 | 54.82 | 45.77 | 19.8 |

*Data in these columns rounded off to two most significant decimal places

TABLE 2

| IBM Type I twisted pair, 150 ohm Z, 100 meters (m) long | | | |
|---|---|---|---|
| Length (m) | Measured Impedance | Corrected Impedance | % Error |
| 10.65 | 164.87* | 152.37* | 8.2 |
| 21.30 | 168.83 | 147.41 | 14.5 |
| 31.95 | 172.85 | 149.22 | 15.8 |
| 40.47 | 172.85 | 147.88 | 16.9 |
| 51.12 | 176.94 | 149.70 | 18.2 |
| 59.64 | 181.10 | 151.87 | 19.2 |
| 70.29 | 185.33 | 153.73 | 20.6 |
| 80.94 | 185.33 | 152.07 | 21.9 |
| 89.46 | 185.33 | 150.78 | 22.9 |
| 100.11 | 189.64 | 152.65 | 24.2 |

*Data in these columns rounded off to two most significant decimal places

As is evident from a review of these tables, there may be a significant difference between measured and corrected impedance values due to the "dribble up" effect. In some transmission lines tested, the difference has been forty percent (40%). The impact of using the method of the present invention is to provide a more accurate measure of transmission impedance. Further, the method employs an algorithm which is easy to use;

regardless of whether the testing is done using a variety of instruments, or a single instrument 1. As a result of using the method of the invention, transmission lines or cables with significant faults are more easily spotted so they can be replaced. Otherwise, the "dribble up" effect may mask a bad cable with deleterious results on the information transmitted over it.

Having thus described the invention, what is claimed and desired to be secured by Letters Patent is:

1. A method for measuring the impedance of a transmission line comprising:
   measuring the length and D.C. loop resistance of the line;
   transmitting along the line a pulse having a pulse duration greater than the time required for it to propogate from its source to the end of the transmission line and reflect back to the source;
   monitoring transmitted and reflected pulses and converting readings resulting therefrom to a gross impedance measurement; and,
   correcting the gross impedance measurement for the "dribble up" effect as a function of D.C. loop resistance in the transmission line, the corrected measurement being an accurate measurement of the line impedance.

2. The method of claim 1 further including terminating the transmission line in a short circuit.

3. The method of claim 1 wherein the length of the transmission line is measured by transmitting a pulse along the line from the source and measuring the time it takes the pulse to propogate to the end of the line and be reflected back to the source, the length of the line being calculated in accordance with the formula $$L = (nvp \times T)/2$$

where L is the length of the line, nvp is the known propogation rate of the pulse for the type of line being measured, and T is the length of time for the pulse to be propogated along the length of the line and return.

4. The method of claim 3 wherein the loop resistance of the line is determined in accordance with the formula $$r = R/L$$

where r is the loop resistance, R is resistance of the line in ohms, and L is the length of the line.

5. The method of claim 4 further including matching the characteristic impedance of the source that of the line.

6. The method of claim 4 wherein the gross impedance measurement is calculated in accordance with the formula $$Z(t) = Z(o) \times \frac{(1 + rho(t))}{(1 - rho(t))}$$

where Z(t) is the gross impedance measurement, Z(o) is the measured near-end line impedance, and rho(t) is the ratio of the voltage amplitude of the reflected pulse to that of the transmitted pulse at time t.

7. The method of claim 6 wherein the corrected impedance is calculated in accordance with the formula $$Zo(n) = Zo \times \frac{Z(nvp \times t/2)}{Zo + (A \times r \times nvp \times (t/2))}$$

where Zo(n) is the line impedance corrected for "dribble up", and A is an arbitrary constant fixed by the time at which Zo is measured.

8. The method of claim 7 wherein A=1 and the corrected impedance is calculated in accordance with the formula $$Zo(n) = Z(nvp \times t/2) - r \times nvp \times (t/2).$$

9. The method of claim 1 wherein the gross impedance measurement is also corrected as a function of line length, impedance measured near the end of the transmission line, pulse propogation time from the source to the end of the line, and pulse propogation rate are also taken into account in determining the correct impedance.

10. A method for improving the accuracy of impedance measurements for cables used in transmission lines comprising:
    determining the length of the cable in accordance with the formula $$L = (nvp \times T)/2$$

where L is the cable length, nvp is the propagation time of the pulse, and T is the propagation and return time for the pulse;
   determining the D.C. loop resistance of the cable in accordance with the formula $$r = R/L$$

where r is the loop resistance, R is the cable resistance in ohms and L is the cable length;
   transmitting along the cable a pulse having a pulse duration greater than the time required for it to propagate from end of the cable to the other and reflect back;
   monitoring the transmitted and reflected pulses and converting the readings therefrom to a gross impedance measurement in accordance with the formula $$Z(t) - Z(o) \times \frac{(1 + rho(t))}{(1 - rho(t))}$$

where Z(t) is the gross impedance measurement, Z(o) is the measured first said end cable impedance, and rho(t) is the ratio of the voltage amplitude of the reflected pulse to that of the transmitted purse at time (t); and,
   correcting the gross impedance measurement for the "dribble up" effect as a function of the D.C. loop resistance and in accordance with the formula $$Z(o)(n) - Z(o) \times \frac{Z(nvp \times t/2)}{Z(o) + (A \times r \times nvp \times (t/2))}$$

where Z(o)(n) is the cable impedance corrected for the "dribble up" effect, and A is an arbitrary consistent fixed by the time at which Z(o) is measured, the corrected impedance Z(o)(n) being an accurate measurement of cable impedance.

11. The method of claim 10 further including terminating the cable in a short circuit.

12. The method of claim 11 further including matching the characteristic impedance of the source of pulses with that of the cable.

13. The method of claim 10 wherein A=1 and the corrected impedance is calculated in accordance with the formula $$Z(o)(n) = Z(nvp \times t/2) - r \times nvp \times (t/2).$$

14. A method for measuring the impedance of a transmission line comprising:
   measuring the length and D.C. loop resistance of the line;
   transmitting along the line a pulse having a pulse duration greater than the time required for it to propagate from its source to the end of the transmission line and reflect back to the source;
   monitoring transmitted and reflected pulses and converting readings resulting therefrom to a gross impedance measurement; and,
   correcting the gross impedance measurement for the "dribble up" effect by subtracting therefrom the D.C. loop resistance in the transmission line, the corrected measurement being an accurate measurement of the line impedance.

* * * * *

UNITED STATES PATENT AND TRADEMARK OFFICE
CERTIFICATE OF CORRECTION

PATENT NO. : 5,063,353

DATED : November 5, 1991

INVENTOR(S) : Roland W. Gubisch

It is certified that error appears in the above-identified patent and that said Letters Patent is hereby corrected as shown below:

COLUMN 6;

Claim 10, line 50 is "transmitted purse" should be --transmitted pulse--.

Signed and Sealed this

Second Day of March, 1993

Attest:

STEPHEN G. KUNIN

Attesting Officer

Acting Commissioner of Patents and Trademarks